(12) United States Patent
Cheng et al.

(10) Patent No.: US 6,395,633 B1
(45) Date of Patent: May 28, 2002

(54) METHOD OF FORMING MICRO-VIA (75) Inventors: Jao-Chin Cheng, Hsinchu; Chang-Chin Hsieh, Taipei; Chih-Peng Fan, Taipei Hsien; Chin-Chung Chang, Taoyuan, all of (TW)

(73) Assignee: World Wiser Electrics Inc., Taoyuan Hsien (TW)

( * ) Notice: Subject to any disclaimer, the term of this patent is extended or adjusted under 35 U.S.C. 154(b) by 0 days.

(21) Appl. No.: 09/871,206

(22) Filed: May 31, 2001

(30) Foreign Application Priority Data

May 16, 2001 (TW) ............................................ 90111679

(51) Int. Cl.[7] .............................................. H01L 21/44
(52) U.S. Cl. ....................... 438/687; 438/678; 438/637; 438/672
(58) Field of Search ................................ 438/637–640, 438/687, 631, 633, 626, 645, 672, 675, 678

(56) References Cited

U.S. PATENT DOCUMENTS

| | | | | |
|---|---|---|---|---|
| 5,925,930 A | * | 7/1999 | Farnworth et al. | .......... 257/737 |
| 5,946,600 A | * | 8/1999 | Hurwitz et al. | ............. 438/635 |
| 6,020,640 A | * | 2/2000 | Efland et al. | ................ 257/751 |
| 6,100,582 A | * | 8/2000 | Omote et al. | ................ 257/699 |
| 6,255,126 B1 | * | 7/2001 | Mathieu et al. | ............... 438/14 |
| 6,300,242 B1 | * | 10/2001 | Ueda et al. | .................. 438/638 |

FOREIGN PATENT DOCUMENTS

JP 2001077145a * 3/2001 ........... H01L/21/60

* cited by examiner

*Primary Examiner*—Charles Bowers
*Assistant Examiner*—Thanh Nguyen
(74) *Attorney, Agent, or Firm*—J. C. Patents (57) ABSTRACT

A method of forming a micro-via, for fabrication and design of a layout of a circuit board. A patterned conductive wiring layer is formed on the substrate. A copper layer is plated onto the substrate and the conductive wiring layer. A photoresist layer is formed on the copper layer. A part of the photoresist layer is removed to expose a part of the copper layer. Using the copper layer as a seed layer, a conductive pillar is formed on the exposed part of the copper layer. The photoresist layer is removed. The exposed plated copper layer is removed. An insulation layer is formed on surfaces of the substrate and the conductive pillar. A part of the insulation layer is removed to expose the conductive pillar. A patterned conductive wiring layer is formed on the conductive pillar.

17 Claims, 7 Drawing Sheets

METHOD OF FORMING MICRO-VIA

CROSS-REFERENCE TO RELATED APPLICATION

This application claims the priority benefit of Taiwan application serial no. 90111679, filed on May 16, 2001.

BACKGROUND OF THE INVENTION

1. Field of the Invention

The invention relates in general to a method of forming a micro-via. More particularly, the invention relates to a method of forming a micro-via that electrically connects neighbouring conductive layers in a printed circuit board.

2. Description of the Related Art

In the recent years, as the electronic products have been developed to be light, thin, short and small, the layout and fabrication of a printed circuit board (PCB) has necessarily been improved. To increase the layout density of the circuit, in addition to thinning the wires, a via used to electrically connect two neighboring conductive layers can be shrunk to operate the circuit with an enhanced efficiency.

In the prior art, a method of mechanically drilling through a hole is used to form a via hole in a printed circuit board. The minimum bore of the via hole is 0.2 mm. Being restricted by the accuracy of the mechanical process, the bore cannot be further decreased. Therefore, further wire refinement cannot be achieved. If a laser is used to for the hole drilling process, the bore can be further reduced.

As the integration of the electronic products increases, and the function thereof becomes more powerful the number of deposition layers is increased from one or two to five or six, and may even exceed ten. The electronic products can thus be accommodated in the printed circuit board with a more compact space. Accordingly, the bores of the laser drilled holes for high density interconnection becomes smaller and smaller. Once the position of the hole slightly shifts or deviates, the electric conduction is seriously affected. As a result, the reliability of the printed circuit board is lowered, and the fabrication cost is greatly increased due to the degradation of yield.

Figure 1A:
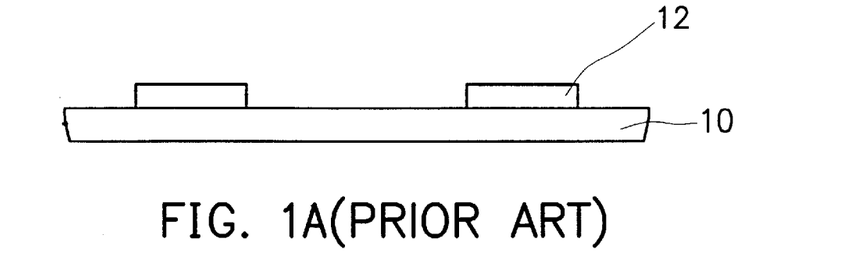
FIGS. 1A to 1G show a method using laser to form a via to connect two neighbouring conductive layers in a printed circuit board.
Figure 1B:
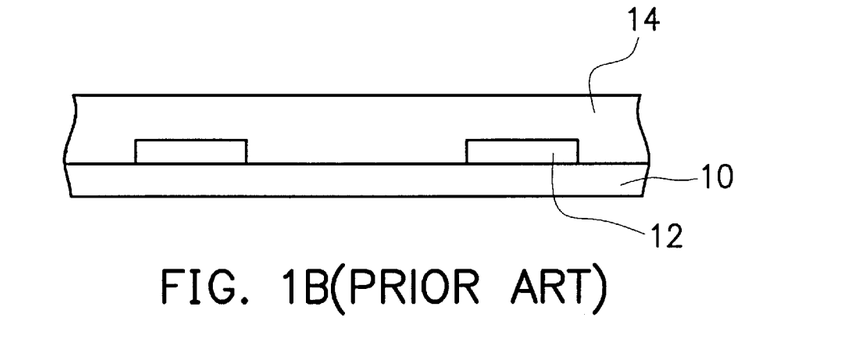
Figure 1C:
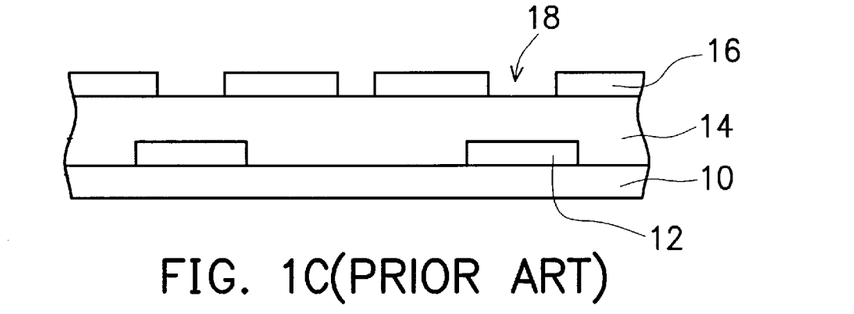

FIG. 1A to FIG. 1G show the method of forming a via for connecting the neighboring conductive layers in a printed circuit board using a laser. In FIG. 1A, a substrate 10 is provided. The substrate 10 can be an inner substrate or an insulation layer. A patterned conductive wiring layer 12 is formed on the substrate 10 by photolithography and etching. In FIG. 1B, an insulation layer 14 is formed on the conductive wiring layer 12 and the substrate 10. In FIG. 1C, a patterned conductive wiring layer 16 with openings 18 are formed on the insulation layer 14.

Figure 1D:
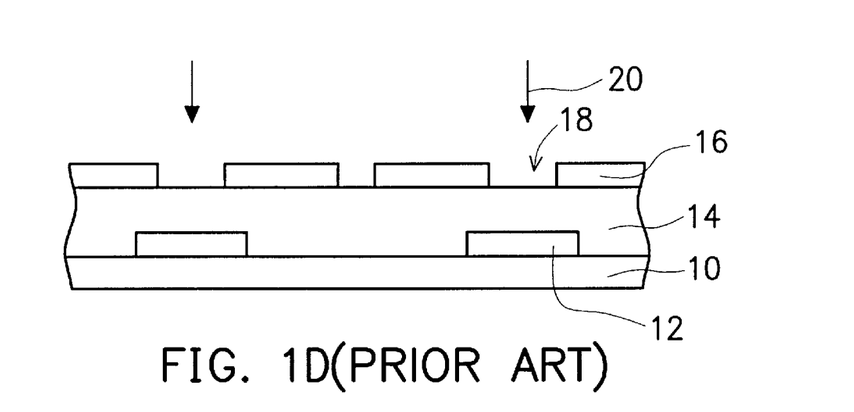
Figure 1E:
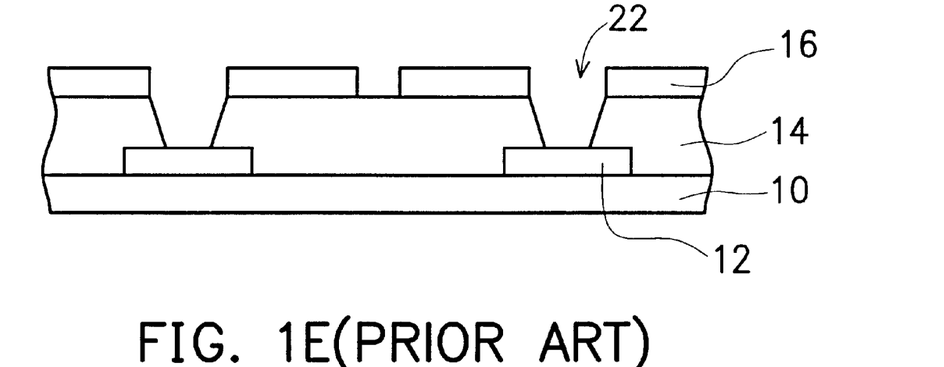
Figure 1F:
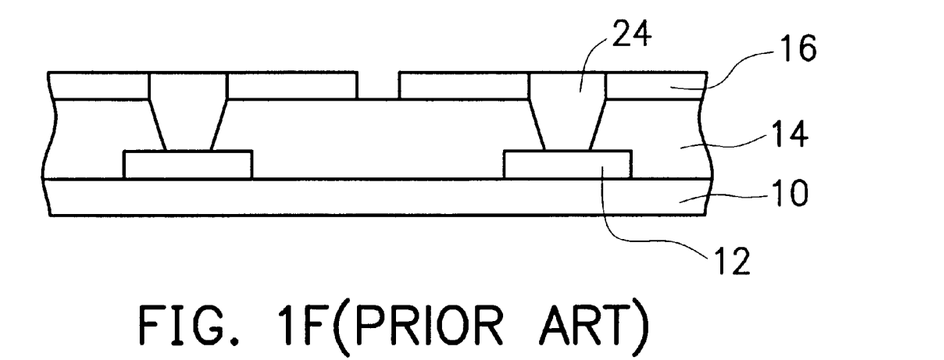
Figure 1G:
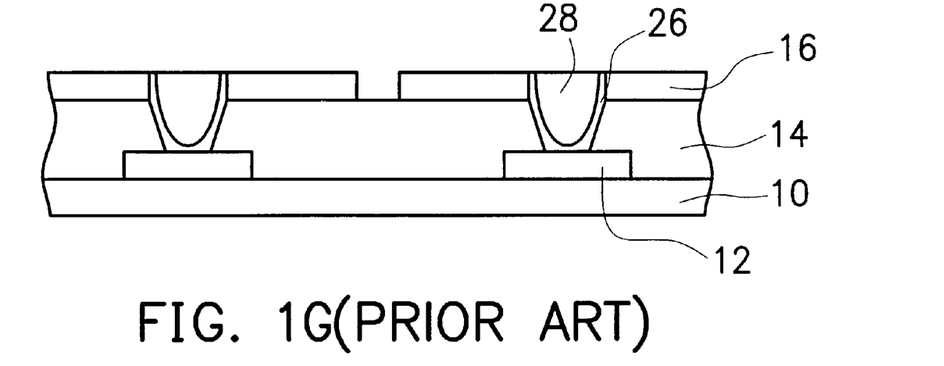

In FIG. 1D, in the direction indicated by the arrows 20, a laser drill operation is performed on the insulation layer 14 exposed by the openings 18. In FIG. 1E, via holes 22 are formed in the insulation layer 14 to expose a surface of the conductive wiring layer 12. In FIG. 1F, using screening printing, the via hole 22 is filled with a conductive material that serves as the vias 24 electrically connecting the conductive wiring layers 12 and 16. Or, as shown in FIG. 1G, a via copper layer 26 is plated onto surfaces of the via holes 24, followed by filling the via holes 24 with an insulation layer 28. The via copper layer 26 provides the electric connection between the conductive wiring layers 12 and 16.

The above laser drill through hole method introduces the following problems:

1. In the laser drilling process, if the laser is not precisely aligned with the opening of the conductive wiring layer, the insulation layer exposed by the opening cannot be effectively removed. Thus, conduction between two conductive wiring layers cannot be established, and the original wiring layout is altered.
2. The bore of the via can be reduced to less than 0.2 mm using a laser drilled through hole. However, the bore is still much larger than that of the via formed using photolithography, so there is still a limit to bore shrinkage when using the laser drill.
3. When filling the via hole with conductive material, if a cavity structure such as a bubble is formed in the conductive material, a popcorn structure is formed during heating. This damages the conductive wiring structure.
4. For the screen printing method, the conductive material filling the via hole uses many metal conductive particles mixed with liquid glue to increase fluidity. However, the material uniformity of the conductive material is consequently decreased to affect the stability of conduction.

SUMMARY OF THE INVENTION

The invention provides a method of forming a micro-via that provides electric connection between neighboring conductive wiring layers of a printed circuit board to resolve the problems occurring in the prior art. The method can be applied to fabrication and design of the layout of a circuit board. A substrate and a patterned conductive wiring layer on the substrate are provided. A copper layer is plated on surfaces of the substrate and the conductive wiring layer. A photoresist layer is formed on the plated copper layer. A part of the photoresist layer is removed to expose a part of the plated copper layer. Using the plated copper layer as a seed layer, a conductive pillar is formed on the exposed plated copper layer. The photoresist layer is removed, and the plated copper layer that is exposed after removing the photoresist layer. Another insulation layer is formed on surfaces of the substrate and the conductive pillars. A part of the insulation layer is removed to expose the conductive pillar. Another copper layer is plated onto surfaces of the conductive pillars and the insulation layer. A second photoresist layer is formed on the plated copper layer. A part of the second photoresist layer is removed to expose a part of the second copper layer. Again, using the second copper layer as a seed layer, a conductive pillar is formed on the exposed second copper layer. The second photoresist layer is removed.

Both the foregoing general description and the following detailed description are exemplary and explanatory only and are not restrictive of the invention, as claimed.

DESCRIPTION OF THE PREFERRED EMBODIMENTS

FIG. 2A to FIG. 2J show the fabrication process of a micro-via in one embodiment of the invention.

Figure 2A:
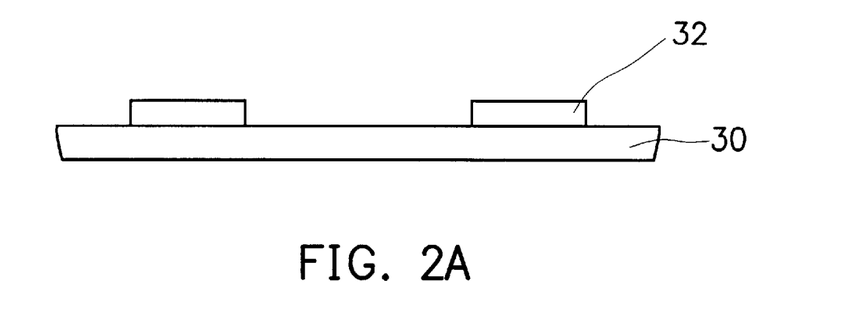
FIGS. 2A to 2J show the fabrication process of forming a micro-via according to the invention.

In FIG. 2A, a substrate 30, for example, an inner substrate of a printed circuit board, is provide to carry wiring circuit formed subsequently. The substrate 30 comprises a FR-4 substrate made of prepreg, such as glass epoxy, a BT substrate made of bismaleimide-triazine, or an insulation layer for accommodating several conductive wiring layers thereon. A patterned conductive wiring layer 32 is formed on the substrate 30. The material of the patterned conductive wiring layer 32 includes copper (Cu), and the conductive wiring layer 32 is patterned using photolithography and etching, for example.

Figure 2B:
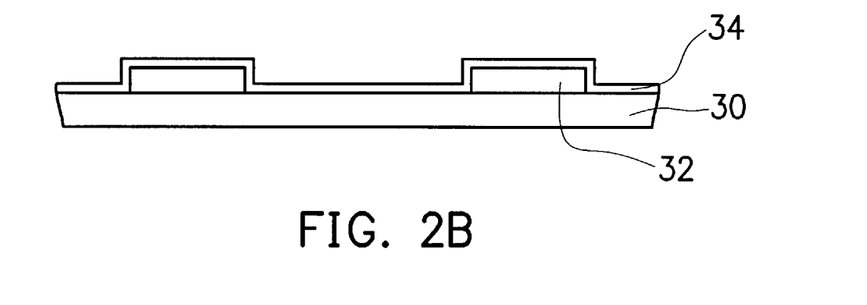
Figure 2C:
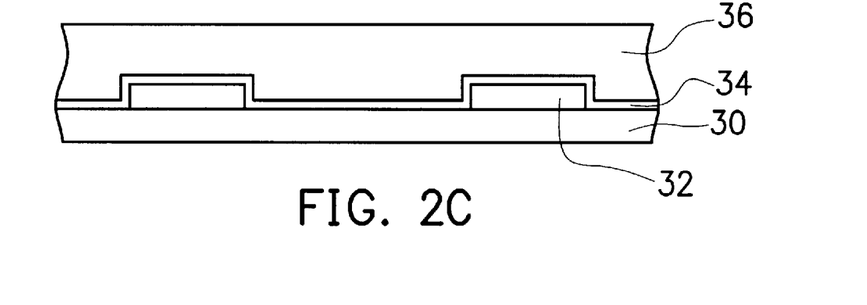

In FIG. 2B, a copper layer 34 is plated on the substrate 30 and the conductive wiring layer 32. The material of the copper layer 34 includes the chemical copper formed by oxidoreductase reaction. The copper layer 34 is used as a seed layer for subsequent electroplating process. In FIG. 2C, a photoresist layer 36 is formed on the plate copper layer 34.

Figure 2D:
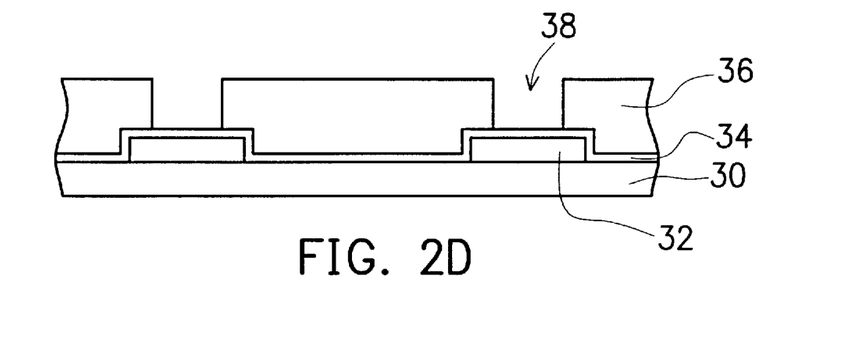
Figure 2E:
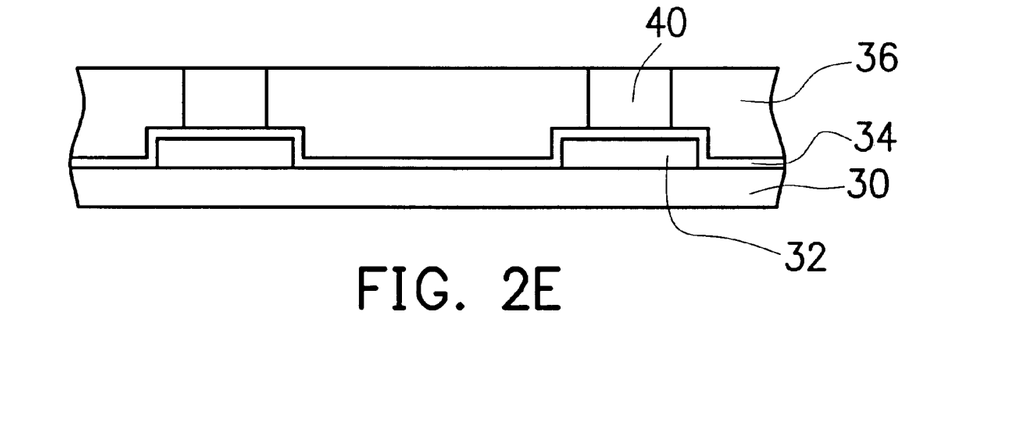
Figure 2F:
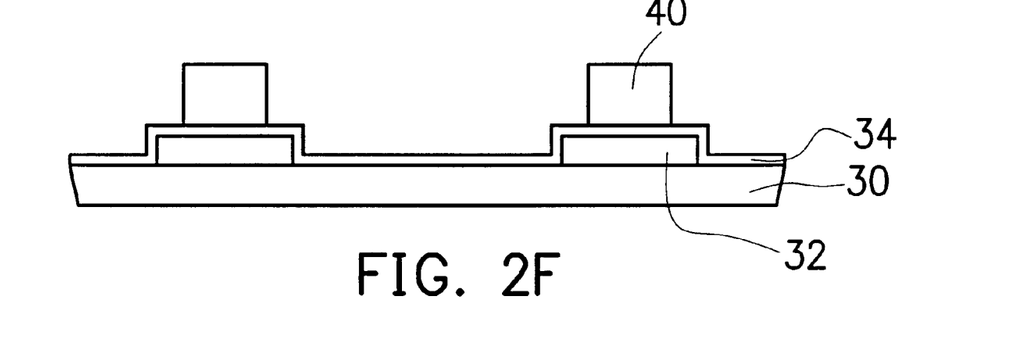

In FIG. 2D, the photoresist layer 36 is patterned to form via holes 38 exposing a part of the plated copper layer 34. Preferably, the via holes 38 are aligned over the conductive wiring layer 32. The method for patterning the photoresist layer includes photolithography and development. In FIG. 2E, the plated copper layer 34 is used as a seed layer to form conductive pillars 40 filling the via holes 38. In FIG. 2F, the photoresist layer 36 is removed to expose the conductive pillars 40 and a part of the plated copper layer 34.

Figure 2G:
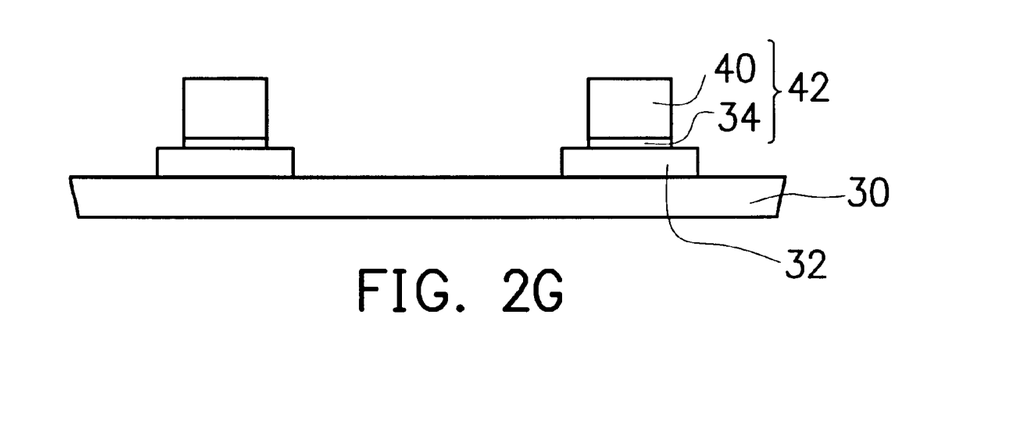
Figure 2H:
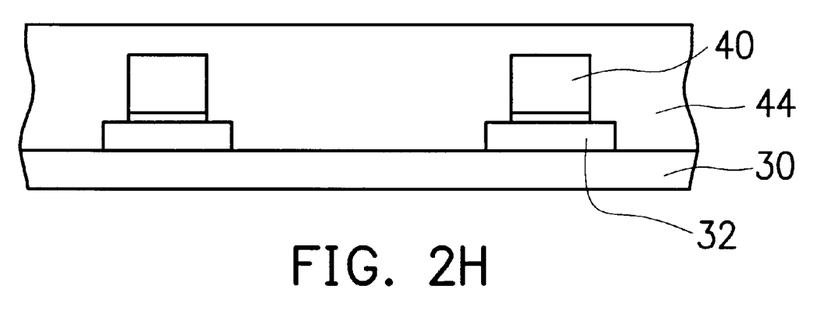

In FIG. 2G, the exposed plated copper layer 34 is removed to avoid any unwanted electric connection. The conductive pillars 40 and the remaining plated copper layer 34 together form the conductive pillars, that is, the micro-vias 42. Preferably, the micro-vias 42 have a cylindrical shape. The method to remove the exposed plated copper layer 34 includes a flash etching step. As the thickness of the plated copper layer 34 is far thinner than that of the copper plated layer 34, the conductive wiring layer 32 and the conductive pillars 40 are not damaged thereby. In FIG. 2H, an insulation layer 44 is formed on surfaces of the substrate 30 and the conductive pillars 40. The material of the insulation layer 44 comprises epoxy, liquid insulation material or other insulation material.

Figure 2I:
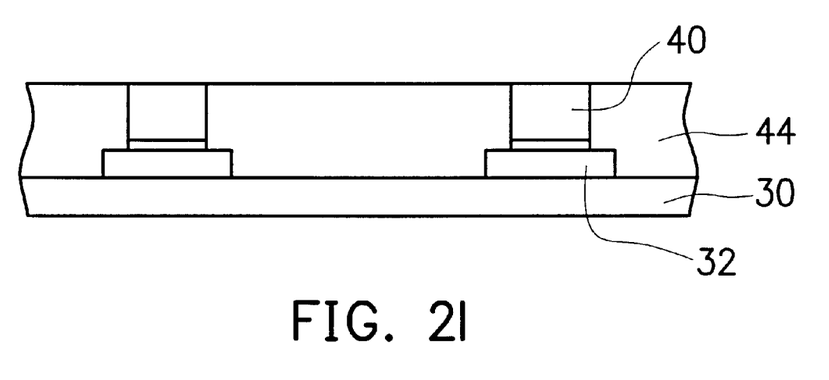
Figure 2J:
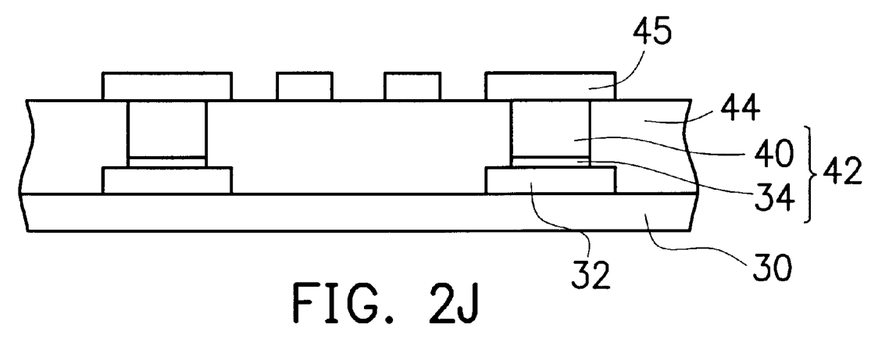

In FIG. 2I, the excessive thickness of the insulation layer 44 is polished away until the conductive pillars 40 are exposed. In FIG. 2J, a patterned conductive wiring layer 45 is formed on the conductive pillars 40 and the insulation layer 44. The material of the conductive wiring layer 45 comprises copper, and the method for patterning includes photolithography and etching, for example. A part of the conductive wiring layer 45 is located on the conductive pillars 40. Therefore, the conductive wiring layer 45 is electrically connected to the conductive wiring layer 32 via the micro-vias 42.

Figure 3A:
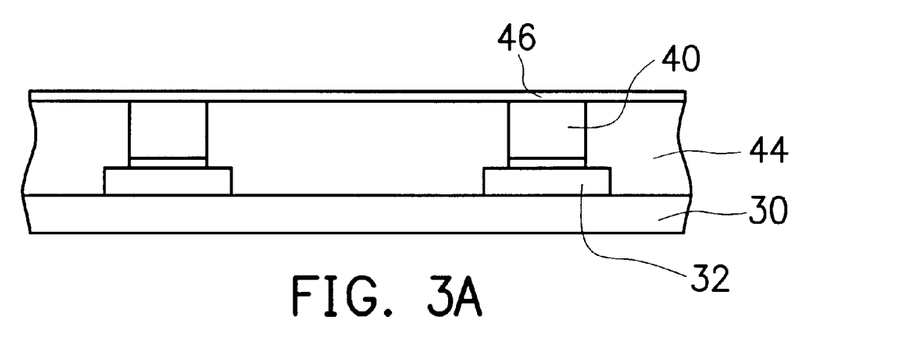
FIG. 3A to FIG. 3F show the fabrication process of a patterned conductive wiring layer.
Figure 3B:
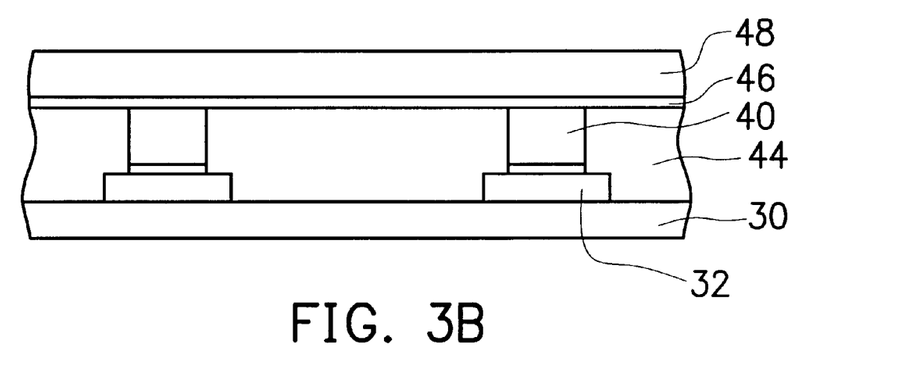

In addition to the conductive wiring layer 45 formed by photolithography and etching as shown in FIG. 2J, another method for forming patterned conductive wiring layer 45 is shown in FIGS. 3A to 3F. Following FIG. 2I, a copper layer 46 is plated on the insulation layer 44 and the conductive pillars 40. The plated copper layer 46 is made of a deposited copper obtained from an oxidoreductase reaction. The plated copper layer 46 is used as a seed layer for a subsequent process. In FIG. 3B, a photoresist layer 48 is formed on the plated copper layer 46.

Figure 3C:
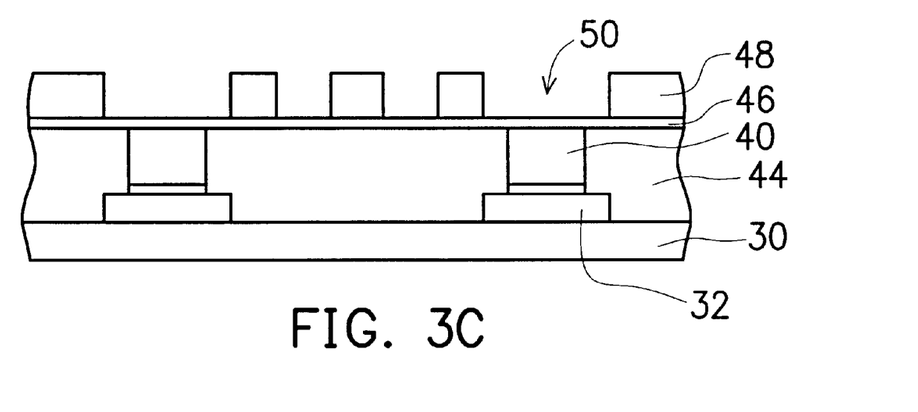
Figure 3D:
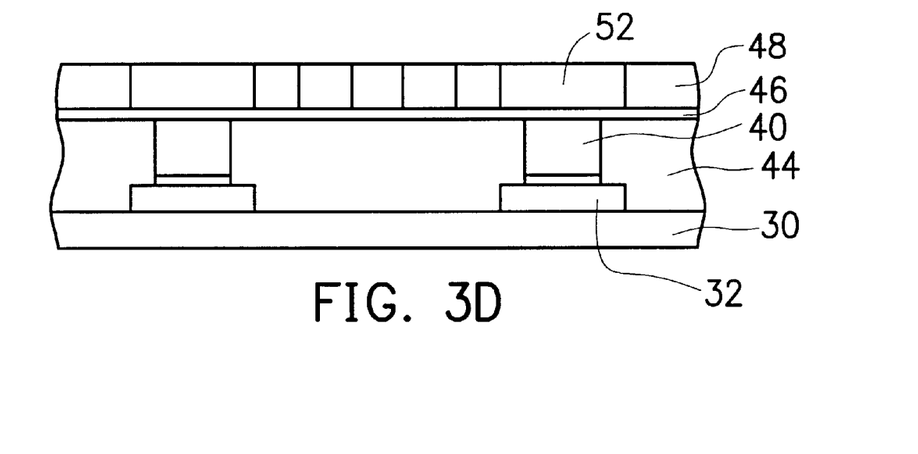
Figure 3E:
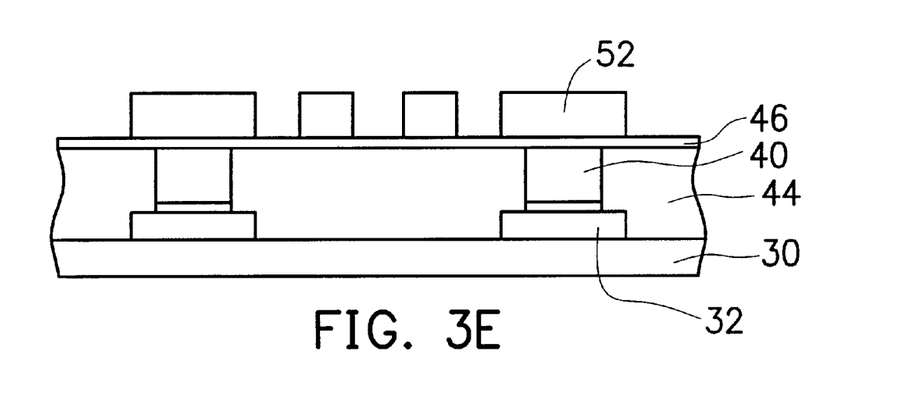
Figure 3F:
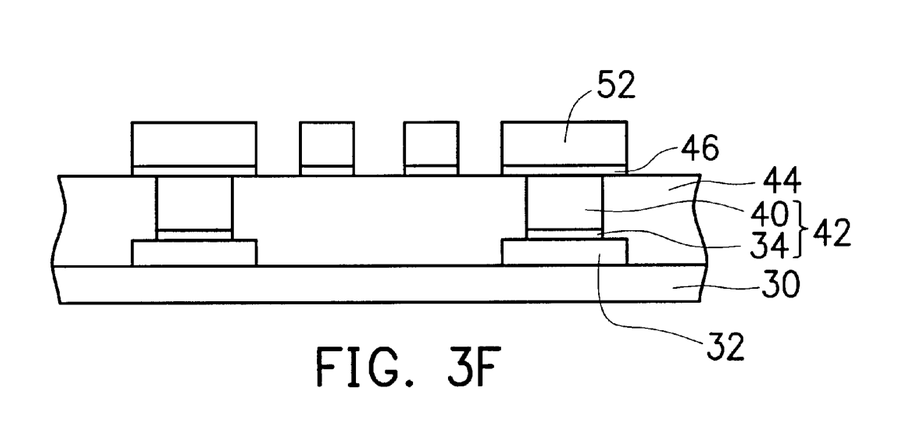

In FIG. 3C, the photoresist layer 48 is patterned to form openings 50 that expose a part of the plate copper layer 46. Preferably, as shown in FIG. 3C, at least one of the openings 50 is aligned over the conductive pillars 40. In FIG. 3D, using the exposed plated copper layer 46 as a seed layer, the openings 50 are filled with a conductive wiring layer 52. In FIG. 3F, the photoresist layer 48 is removed to expose the conductive wiring layer 52 and a part of the plated copper layer 46. As shown in FIG. 3F, the exposed plated copper layer 46 is removed to avoid unwanted electric connection. The method for removing the exposed plated copper layer 46 includes flash etching. Again, as the plated copper layer 46 has a thickness far smaller than that of the conductive wiring layer 52, so that the flash etching step does not damage the conductive wiring layer 52. Via the micro-vias 42, the conductive wiring layers 52 and 32 are electrically connected.

According to the above, the method of forming the micro-vias has the following advantages:

(1) The material of the micro-via formed in the invention includes copper that has an excellent conduction property. Compared to the conventional conductive paste, an improved conductivity is obtained in the invention.

(2) The micro-via formed by electroplating has a higher density than the conductive paste used to fill the via hole. The micro-via thus has a better material uniformity.

(3) The micro-via formed in the invention is accommodated in a via hole formed from photolithography and etching. Therefore, the micro-via is formed with a diameter much smaller than that formed by laser drill. The integration of the circuit is further increased.

(4) In one step of the invention, the insulation layer is polished with a required thickness. The insulation layer and the conductive pillars achieve a better planarity thereby, so that the material uniformity is improved.

(5) As the micro-via is formed by photolithography and etching steps, so that a higher precision in alignment is obtained compared to the laser drill method.

(6) Due to the advantages in (1) to (5), the printed circuit board with the micro-via has a better reliability.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a micro-via, comprising:
providing a substrate and a patterned first conductive wiring layer on the substrate;
forming a plated copper layer on the substrate and the first conductive wiring layer;
forming a photoresist layer on the plated copper layer;
removing part of the first photoresist layer to expose a part of the plated copper layer;
forming a conductive pillar on the exposed part of the plated copper layer;
removing the photoresist layer;
removing the exposed part of the plated copper layer;
forming an insulation layer on the substrate and the conductive pillar;
removing a part of the insulation layer to expose the conductive pillar; and
forming a patterned second conductive wiring layer on the conductive pillar.

2. The method according to claim 1, wherein the substrate is an inner layer substrate.

3. The method according to claim 1, wherein the substrate is an insulation layer.

4. The method according to claim 1, wherein the part of the photoresist layer is removed by photolithography and development.

5. The method according to claim 1, wherein the conductive pillar is formed by electroplating.

6. The method according to claim 1, wherein the part of the insulation layer is removed by polishing.

7. The method according to claim 1, wherein the first conductive wiring layer is patterned by photolithography and etching.

8. The method according to claim 1, wherein the second conductive wiring layer is patterned by photolithography and etching.

9. A method of forming a micro-via, comprising:

providing a substrate and a first conductive wiring layer on the substrate;

forming a first plated copper layer on the substrate and the first conductive wiring layer;

forming a first photoresist layer on the first plated copper layer;

removing a part of the first photoresist layer to expose a part of the first plated copper layer;

forming a conductive pillar on the exposed part of the first plated copper layer;

removing the first photoresist layer;

a removing the exposed part of the first plated copper layer;

forming an insulation layer on the substrate and the conductive pillar;

removing a part of the insulation layer until the conductive pillar is exposed;

forming a second plated copper layer on the insulation layer and the conductive pillar;

forming a second photoresist layer on the second plated copper layer;

removing a part of the photoresist layer to expose a part of the second plated copper layer;

forming a second conductive wiring layer on the exposed second plated copper layer; and removing the second photoresist layer.

10. The method according to claim 9, wherein the substrate is an inner layer substrate.

11. The method according to claim 9, wherein the substrate is an insulation layer.

12. The method according to claim 9, wherein the part of the first conductive wiring layer is removed by photolithography and development.

13. The method according to claim 9, wherein the part of the first photoresist layer is removed by photolithography and development.

14. The method according to claim 9, wherein the conductive pillar is formed by electroplating.

15. The method according to claim 9, wherein the insulation layer is removed by polishing.

16. The method according to claim 9, wherein the second photoresist layer is patterned by photolithography and etching.

17. The method according to claim 9, wherein the second conductive wiring layer is formed by electroplating.

* * * * *